(12) United States Patent
Lu et al.

(10) Patent No.: US 8,083,063 B2
(45) Date of Patent: Dec. 27, 2011

(54) RETICLE POD AND SUPPORTING COMPONENTS THEREBETWEEN

(75) Inventors: Pao-Yi Lu, Tucheng (TW); Sheng-Hung Wang, Tucheng (TW)

(73) Assignee: Gudeng Precision Industrial Co, Ltd, Taipei County (TW)

( * ) Notice: Subject to any disclaimer, the term of this patent is extended or adjusted under 35 U.S.C. 154(b) by 161 days.

(21) Appl. No.: 12/726,170

(22) Filed: Mar. 17, 2010

(65) Prior Publication Data
US 2011/0155598 A1 Jun. 30, 2011

(30) Foreign Application Priority Data
Dec. 29, 2009 (TW) ................................ 98145424 A

(51) Int. Cl.
*B65D 85/48* (2006.01)
(52) U.S. Cl. ........................................ 206/454; 206/710
(58) Field of Classification Search .................. 206/454, 206/455, 706, 710, 449, 701, 722–724, 349, 206/559, 560, 480, 482, 483, 832; 211/41.14, 211/41.17, 41.18; 355/72, 75; 118/500; 414/217.1, 940
See application file for complete search history.

(56) References Cited

U.S. PATENT DOCUMENTS

| | | | |
|---|---|---|---|
| 3,615,006 A * | 10/1971 | Freed | 206/454 |
| 6,216,873 B1 * | 4/2001 | Fosnight et al. | 206/710 |
| 6,338,409 B1 * | 1/2002 | Neary | 206/710 |
| 7,400,383 B2 * | 7/2008 | Halbmaier et al. | 206/454 |
| 7,450,219 B2 * | 11/2008 | Matsutori et al. | 206/710 |
| 7,607,543 B2 * | 10/2009 | Gregerson et al. | 206/710 |
| 7,850,009 B2 * | 12/2010 | Wu | 206/710 |
| 7,931,146 B2 * | 4/2011 | Chiu et al. | 206/454 |
| 2009/0218254 A1 * | 9/2009 | Andersen | 206/454 |
| 2009/0301917 A1 * | 12/2009 | Kolbow et al. | 206/454 |

FOREIGN PATENT DOCUMENTS
TW I227210 2/2005
* cited by examiner

*Primary Examiner* — J. Gregory Pickett
*Assistant Examiner* — Andrew Perreault
(74) *Attorney, Agent, or Firm* — Ming Chow; Sinorica, LLC

(57) ABSTRACT

A reticle POD, comprising a top cover, a bottom cover, and a plurality of supporting components deployed in the four corners of the bottom cover, the supporting component comprising: a base body perpendicularly assembled, on two sides of which being disposed with mounting blocks; a pair of elastic elements respectively placed on the base body; a pair of leading elements connecting respectively to the horizontal extension of the elastic elements and then extending lengthwise to form a tip, a first bevel and a second bevel being formed on the side of the tip located on the inner side of the base body; a supporting base plate, the first and the second ends of which being connected to the second bevel of the leading element and a supporting pillar being disposed on the third end of the supporting base plate.

20 Claims, 4 Drawing Sheets

RETICLE POD AND SUPPORTING COMPONENTS THEREBETWEEN

BACKGROUND OF THE INVENTION

1. Field of the Invention

The present field of the invention is related to a reticle POD, and more particularly, to the structure of a reticle POD disposed with a plurality of supporting components.

2. Description of the Prior Art

In modern advanced Foundries or semiconductor Fabs, the level at 90 nm and below process has been achieved in the chip manufacturing process; therefore, the size of pattern on the reticle for lithography process has to be reduced and the width of lines in the pattern needs to be small, and the production cost is thus very high. In order to reduce the high production cost of reticle, modern advanced Foundries or Fabs, especially Foundries or Fabs manufacturing memory products, manage to increase the lifetime of reticle.

Due to needs in the manufacturing process, it is often needed for the reticle to be transferred to and fro between the storage box and the lithography tool. Therefore, the reticle needs to be stored in the reticle POD so that the reticle can be prevented from being contaminated by particles. As the reticle POD needs to be transferred, two concerns thus arise in regard to the process of placing the reticle into the POD: first, the reticle has to be securely mounted so that the reticle will not be damaged due to friction between reticle and POD or between mounting blocks and supporting components caused by ineffective mounting of the reticle; second, the area of the reticle in contact with the mounting blocks or the supporting components has to be reduced in order to reduce the electrostatic effect caused by friction, and more particularly, the contact area is to be limited to the peripheral area of the reticle without pattern so that damages caused by contact or friction between reticle and mounting blocks or supporting components can be avoided. Many patents have thus disclosed designs of supporting components for mounting the reticle. For example, as shown in FIG. 1, Taiwan patent 1227210 discloses structure and deployment of supporting components in a reticle POD. Wherein when the reticle is placed in the reticle POD, only peripheral area of the reticle is in contact with the bevel of supporting components. However, there are two defects in the design of the supporting components. One defect is that the supporting components are fixedly integrated with the reticle POD and each supporting component has a rigid body and lacks cushion-like property. Thus when the reticle POD is dashed or falls down, the impact force will pass through the supporting components and directly to the reticle and may cause partial damage or shattering of the reticle. The other defect is that the design of individual supporting component makes it easier for the reticle to be displaced and thus damaged when the reticle is placed into the POD due to lack of proper leading device.

Therefore, the supporting components need to be designed as having elastic property to effectively reduce the damage of reticle caused in the transferring or storing processes. Moreover, design of effective leading device is also necessary so that the reticle can be automatically led to the position for mounting when being placed into the reticle POD. To achieve the aforementioned, the present invention provides a supporting component structure equipped with elastic property at the area in contact with the reticle and with leading elements for the reticle to be precisely placed into the position for mounting. Furthermore, due to the advancement of the process, in the processes of higher level in Fabs, EMI in Fabs, in addition to electrostatic effect, will also cause damage to the reticle, particularly when the reticle is in the stage of being stored or in the lithography process and changes in the surroundings are hard to predict. Thus, in consideration of possible damages that may be caused by ESD and EMI and need to be prevented, the present invention also provides an embodiment of reticle POD made of metal in addition to reticle POD made of polymer material. Not only can the reticle in the metal reticle POD be effectively mounted and isolated from air, the metal reticle POD can also prevent the reticle from being damaged by ESD and EMI.

SUMMARY OF THE INVENTION

One primary object of the present invention is to provide a reticle POD disposed with a plurality of supporting components, in which the structure of supporting components is used to provide the supporting components with elastic property at the area in contact with the reticle.

Another primary object of the present invention is to provide a reticle POD disposed with a plurality of supporting components, in which the design of leading elements of the supporting components allow the reticle to be precisely placed into the position for mounting.

Still another primary object of the present invention is to provide a metal reticle POD that prevents the reticle from being damaged by the ESD or EMI.

Yet another primary object of the present invention is to provide an airtight reticle POD to isolate the reticle in the reticle POD from air in the exterior to increase the lifetime of reticle.

According to the above-mentioned objects, the present invention first provides a supporting component of substrate, comprising a base body, perpendicularly assembled by one end of two supporting arms, the other end of the two supporting arms being respectively disposed with a mounting block; a pair of elastic elements respectively disposed on two supporting arms, each elastic element extending lengthwise from the supporting arms to form an extension and then extending horizontally along the inner side of the supporting arms to form another extension; a pair of leading elements, respectively connecting to the horizontal extension of the elastic elements and then extending lengthwise to form a stud bump, a first bevel and a second bevel being formed on the side of the stud bump located on the inner side of the supporting arm; a supporting base plate, having a first surface and a second surface opposite to another side of the first surface, the first surface of a first end and of a second end of the supporting base plate being respectively connected to the second bevel of the leading elements, and a supporting pillar being disposed at the second surface of a third end of the supporting base plate neighboring to the third end.

The present invention then provides a reticle POD assembled by a top cover and bottom cover, each corner of the bottom cover of which is disposed with a supporting component for supporting and mounting the reticle and on one side of which is disposed with at least a latch piece for joining the top cover and the bottom cover, wherein the characteristic of the reticle POD lies in that: each supporting component comprises a base body, which is perpendicularly assembled by one end of two supporting arms, the other end of the two supporting arms being respectively disposed with a mounting block; a pair of elastic elements, which are respectively disposed on two supporting arms, each elastic element extending lengthwise from the supporting arms to form an extension and then extending horizontally along the inner side of the supporting arms to form another extension; a pair of leading elements, respectively connecting to the horizontal extension of the elastic elements and then extending lengthwise to form a stud bump, a first bevel and a second bevel being formed on the side of the stud bump located on the inner side of the supporting arm; a supporting base plate, having a first surface and a second surface opposite to another side of the first surface, the first surface of a first end and of a second end of the supporting base plate being respectively connected to the second bevel of the leading elements, and a supporting pillar being disposed at the second surface of a third end of the supporting base plate neighboring to the third end.

The present invention further provides a metal reticle POD that is assembled by a metal top cover and a metal bottom cover, each corner of the metal bottom cover of which is disposed with a supporting component for supporting and mounting the reticle and on one side of which is disposed with at least a latch piece for joining the metal top cover and the metal bottom cover, wherein the characteristic of the metal reticle POD lies in that: each supporting component comprises a base body, which is perpendicularly assembled by one end of two supporting arms, the other end of the two supporting arms being respectively disposed with a mounting block; a pair of elastic elements, which are respectively disposed on two supporting arms, each elastic element extending lengthwise from the supporting arms to form an extension and then extending horizontally along the inner side of the supporting arms to form another extension; a pair of leading elements, respectively connecting to the horizontal extension of the elastic elements and then extending lengthwise to form a stud bump, a first bevel and a second bevel being formed on the side of the stud bump located on the inner side of the supporting arm; a supporting base plate, having a first surface and a second surface opposite to another side of the first surface, the first surface of a first end and of a second end of the supporting base plate being respectively connected to the second bevel of the leading elements, and a supporting pillar being disposed at the second surface of a third end of the supporting base plate neighboring to the third end.

By applying the design provided by the present invention, the reticle can thus be smoothly and easily led into and effectively mounted to the reticle POD, and the function of preventing from ESD and EMI can also be provided. In addition, the reticle POD disclosed by the present invention can also provide an airtight space to protect the reticle and prevent from haze formation and thus increase the lifetime of the reticle.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

As what is disclosed in the present invention is a reticle POD disposed with a plurality of supporting components, the major improvement lies in the portion of supporting components, and the other detailed procedures in the reticle or reticle POD manufacturing or processing processes, including the procedures of forming reticle POD made of polymer material or of metal, are accomplished by utilizing the current technology. Therefore in the following description, the details of reticle or reticle POD manufacturing or processing processes are not completely described. And the drawings referred to in the following are not made according to the actual sizes as the function of which is only to illustrate characteristics of the present invention.

Figure 1:
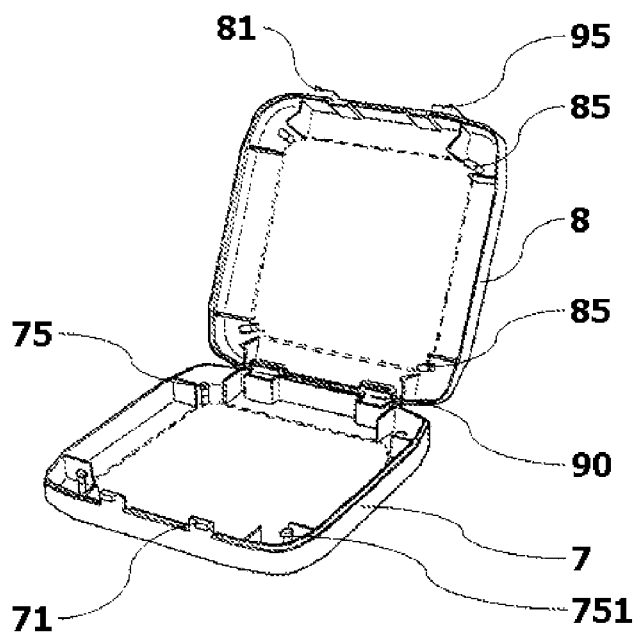
FIG. 1 is a view of the reticle POD of the prior art.
Figure 2:
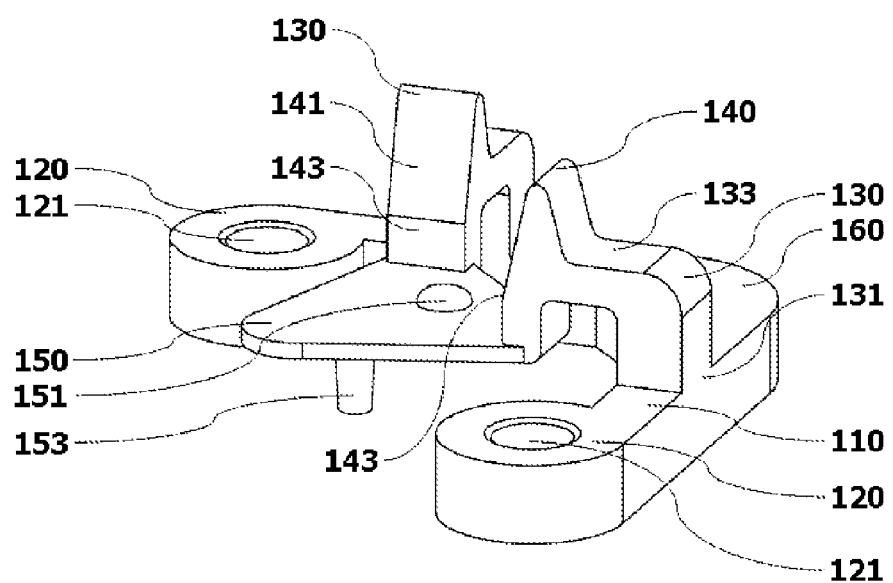
FIG. 2 is a stereoscopic view of the supporting component of the present invention.
Figure 3:
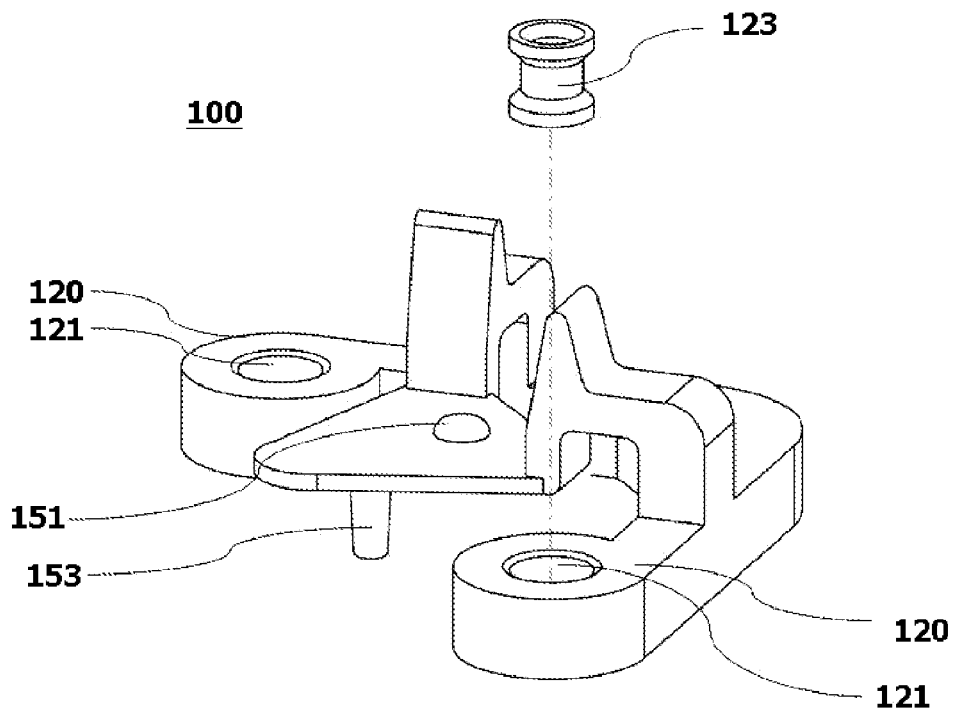
FIG. 3 is a view of the supporting component of the present invention disposed with the hollow stud.

First, referring to FIG. 2, which is a view of the supporting components disposed in the reticle POD of the present invention. As shown in FIG. 2, the supporting component 100 comprises: a base body, assembled by two supporting arms 110, one end of the two supporting arms 110 being perpendicularly connected with each other and the other end of the two supporting arms being respectively disposed with a mounting block 120, wherein the mounting block 120 can be in geometric shape such as being rectangular, polygonal, or cylindrical, and in the embodiment of the present invention, the mounting block 120 is in cylindrical shape; moreover, a through hole 121 can be further formed in the center of the cylinder of the cylindrical mounting block 120 for connecting to the reticle POD. Another special feature is that a hollow stud 123 is further disposed in the through hole 121 of the mounting block 120 of the present invention, as shown in FIG. 3, wherein the hollow stud 123 can be made of metal, stainless steel series, aluminum alloy, or magnesium alloy for example.

Moreover, a protruding flange 160 can be further formed at the place where two supporting arms 110 are perpendicularly assembled to reinforce the structure of supporting component 100; a pair of elastic elements 130 are then respectively disposed on two supporting arms 110, each elastic element 130 extending lengthwise from the supporting arm 110 to form an extension 131 and then extending horizontally along the inner side of supporting arm 110 to form another extension 133; a pair of leading elements 140 are respectively connected to the horizontal extension 133 of the elastic element 130 and extend lengthwise to form a stud bump, a first bevel 141 and a second bevel 143 being formed on the side of the stud bump located on the inner side of the supporting arm, wherein the first bevel 141 facilitates the leading of reticle to the position for mounting in the process of placing the reticle into the reticle POD and the second bevel 143 can be used as restraint to restrain the reticle from moving; therefore, in order for the reticle to be readily led to the position for mounting and be mounted, the angle between the slope of the first bevel 141 and the plane surface of the base body is between 50 and 75 degrees, and in the preferred embodiment of the present invention, the angle between the slope of the first bevel 141 and the plane surface of the base body is 65 degrees; the angle between the slope of the second bevel 143 and the plane surface of the base body is between 70 and 90 degrees, and in the preferred embodiment of the present invention, the angle between the slope of the second bevel 143 and the plane surface of the base body is 80 degrees.

Figure 6:
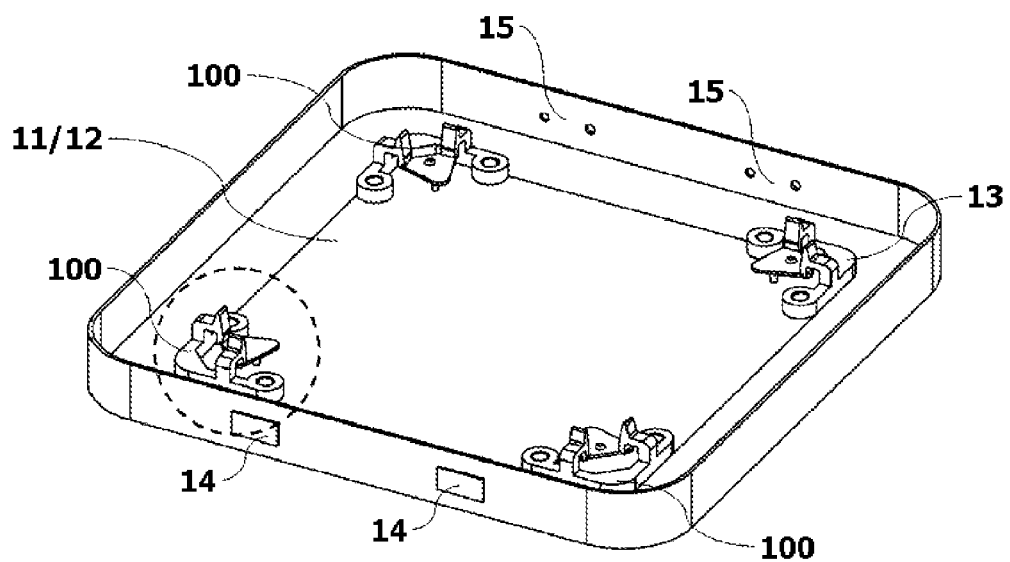
FIG. 6 is a stereoscopic view of the top cover or bottom cover of the present invention disposed with a plurality supporting components.

Furthermore, a supporting base plate 150 having a first surface and a second surface opposite to another side of the first surface is in geometric shape such as being rectangular, polygonal, or triangular. In the embodiment of the present invention, the supporting base plate 150 has a triangular structure, and thus the first surface of the first end and of the second end of the supporting base plate 150 are respectively connected to the second bevel 143 of the leading element 140, and a supporting pillar 153 is disposed at the second surface of the third end of the supporting base plate 150 neighboring to the third end. Wherein, the supporting pillar 153 and the cylindrical mounting blocks 120 on two sides of it are not coplanar. More specifically, the supporting pillar 153 is shorter than the cylindrical mounting blocks 120 on two sides of it, and thus when the supporting component 100 is mounted to the reticle POD via the two cylindrical mounting blocks 120, the supporting pillar 153 will be in the status of being suspended in midair (the status is to be shown and described in FIG. 6). Thus, when a reticle is placed into the reticle POD, a pair of elastic elements 130 can provide elastic interface. When the pair of elastic elements 130 shifts upward or downward while supporting the reticle, the distance of the downward shift can be controlled by the distance of suspension formed by the supporting pillar 153; in the preferred embodiment of the present invention, the distance of suspension of the supporting pillar 153 can be between 0.5 mm and 1.5 mm and is set at 1 mm in the present embodiment. Therefore, the objective of the suspension design of the supporting pillar 153 is to protect the supporting component 100 to prevent from the rupture of elastic element 130 caused by excessive elastic shift due to falling in the reticle placing or transferring process that will then lead to unsuccessful mounting of the reticle and therefore cause damage to the reticle resulted from collision or friction with other parts of reticle POD. Moreover, a tip 151 will be further formed on the first surface of the supporting base plate 150 of the present invention, the main function of which is to provide a contact point for the reticle. As the supporting base plate 150 is equipped with the design of the tip 151, after the reticle is precisely led to the right position by the bevel 141 of the pair of leading elements 140 and restrained by the second bevel 143, the proper design of the tip 151 ensures the right contact area between the tip 151 and the reticle. In a preferred embodiment of the present invention, the position of the tip 151 can be disposed close to the two second bevels 143; apparently, a proper distance is kept between the tip 151 and the supporting pillar 153 in their relative positions.

In addition, the supporting component 100 of the present invention is made of a polymer material, PEEK material in particular, to reduce friction between tip 151 and the reticle and prevent from generation of particles and static electricity. Furthermore, the supporting component 100 of the present invention can also be manufactured by insertion molding, with the method of which the main body of supporting component 100 (except tip 151) is first formed and then the tip 151 is then formed on the proper position on the supporting component 100 using another injection molding method; wherein the material of main body of supporting component 100 can be plastic and only the tip 151 is made of PEEK material and thus the production cost of supporting component 100 can be reduced. If other special factors need to be taken in consideration, surely both the supporting component 100 and the tip 151 thereon can be made of plastic material, which is not limited in the present invention. Thus the supporting component 100 of the present invention can be made of either one kind or two kinds of material.

In the following, the embodiment of the disposition of the aforementioned supporting component 100 in the reticle POD is described. What is to be emphasized is that the main characteristic of the present invention lies in the improvement of the structure of supporting component 100, and the disposition of the supporting component 100 in the reticle POD are embodied in various ways to illustrate how the structure of supporting component 100 can be applied.

Figure 4:
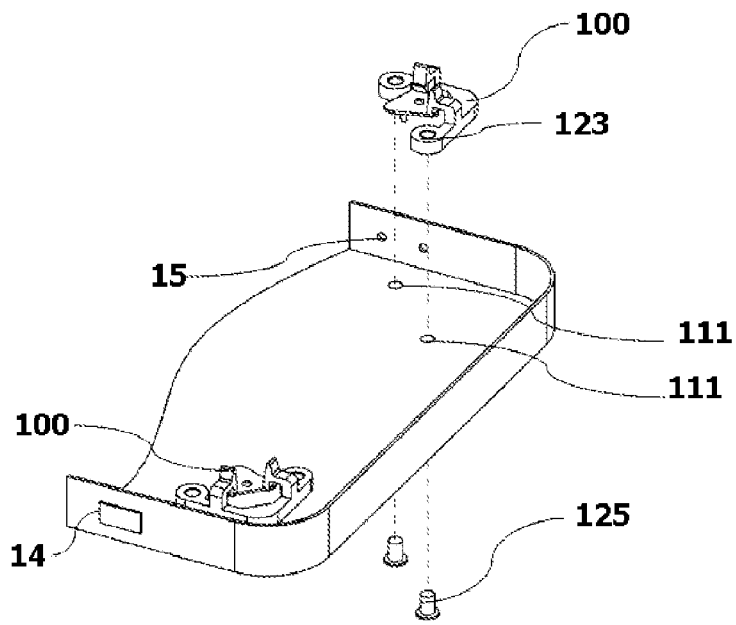
FIG. 4 is a view of the supporting component of the present invention disposed in the reticle POD.
Figure 5:
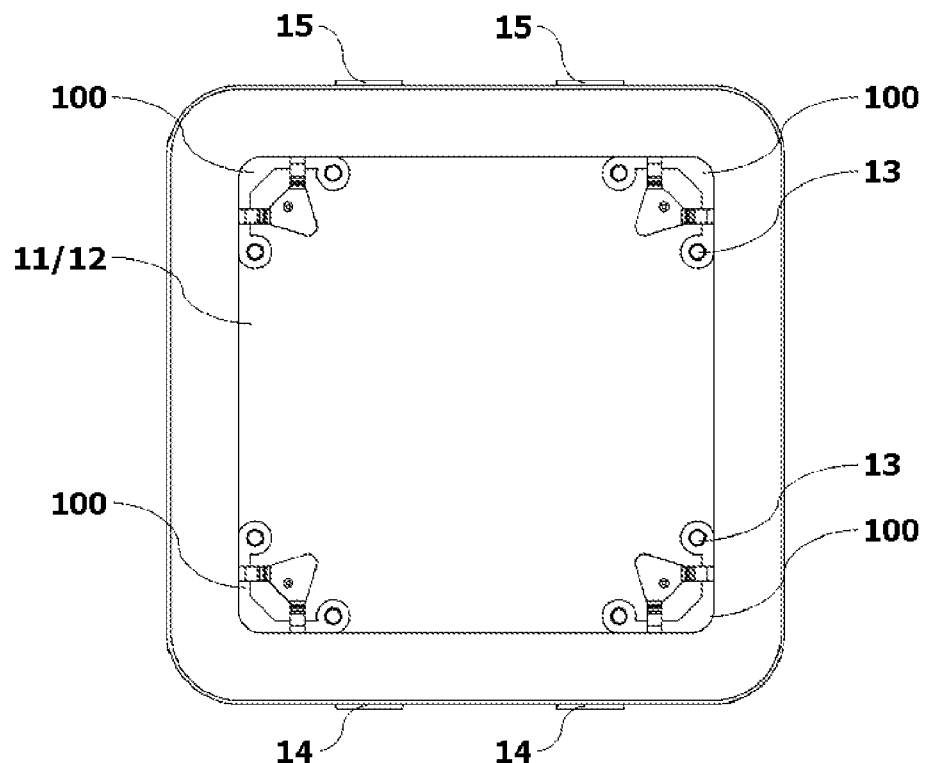
FIG. 5 is a view of the reticle POD of the present invention disposed with a plurality of supporting components.

In the following, referring to FIG. 4, which is a view of the supporting components 100 of the present invention disposed in the reticle POD. The reticle POD 10 in the present invention is a rectangular container body comprising a top cover 11, a bottom cover 12, at least a lock-fastener 15 to rivet assemble the top cover 11, the bottom cover 12, and the plurality of supporting components 100 disposed at the four corners of the top cover 11 and the bottom cover 12, wherein each supporting component 100 is mounted by the hollow stud 123 on the mounting block 120 at two ends of the base body, the lock-fastener hole 111 on the reticle POD 10, and a lock-fastener 125. In a preferred embodiment, the lock-fastener 125 is a rivet; therefore, in each supporting component 100 of the present invention, the hollow stud 123 and the lock-fastener hole 111 on the reticle POD 10 on two ends of the base body are lock-fastened to form a piece via two rivets (for example, the rivets first penetrate from the exterior of the top cover 11 and the bottom cover 12, then pass in sequence the top cover 11, the lock-fastener hole 111 on the bottom cover 12, and the hollow stud 123 on the supporting component 100, and are then stamped on one end to expand to achieve the purpose of mounting) so that each supporting component 100 can be securely assembled with the top cover 11 and the bottom cover 12, as shown in FIG. 5. Moreover, in the present embodiment, the lock-fastener 15 used to rivet assemble the top cover 11 and the bottom cover 12 is a hinge device, wherein the rivet is used to couple the hinge device to the same side of the top cover 11 and the bottom cover 12 so that the top cover 11 and the bottom cover 12 can be assembled as a piece, and the hinge device serves as a pivot on which the top cover 11 and the bottom cover 12 can be opened or closed.

Then, when the top cover 11 and the bottom cover 12 are closed, an accommodation space is formed between the top cover 11 and the bottom cover 12 for the reticle to be placed therein. When a reticle is placed into the reticle POD 10, the reticle will first contact the supporting components 100 disposed at the four corners of the bottom cover 12. As the supporting components 100 are equipped with the design of leading elements 140, the reticle can be precisely led by the bevel 141 of the leading elements 140 to the right position and restrained by the second bevel 143, and thus the reticle is actually in contact with the tip 151 on the supporting components 100. Due to the proper position of tip 151 and the limited area of it in contact with a small peripheral part of the reticle and also the restraint of the second bevel 143, the displacement of the reticle is limited and the friction of reticle or static electricity generated can be avoided. And then, when the top cover 11 and the bottom cover 12 of the reticle POD 10 are closed, the supporting components 100 disposed at the four corners of the top cover 11 are in contact with another side of the reticle for the reticle in the reticle POD 10 to be supported and mounted by the supporting components at the four corners of the top cover 11 and of the bottom cover 12, and thus the security of reticle is ensured. Moreover, the supporting components 100 are equipped with the designs of the elastic elements 130 and of the supporting pillar 153, particularly the suspension design of the supporting pillar 153 (for example, the distance of suspension between the supporting pillar 153 and the top cover 11 and the bottom cover 12 is 1 mm), as shown in the stereoscopic view of reticle POD in FIG. 6 indicated by dashed line. Thus if the reticle POD 10 falls in the transporting or transferring process, the elastic elements 130 absorb the excessive displacement, and the shift of elastic elements 130 is simultaneously restrained by the distance of suspension between the supporting pillar 153 and the top cover 11 or the bottom cover 12. With the excessive impact force absorbed by the design of elastic elements 130 and supporting pillar 153, the reticle can thus be provided with excellent support and protection.

Figure 7:
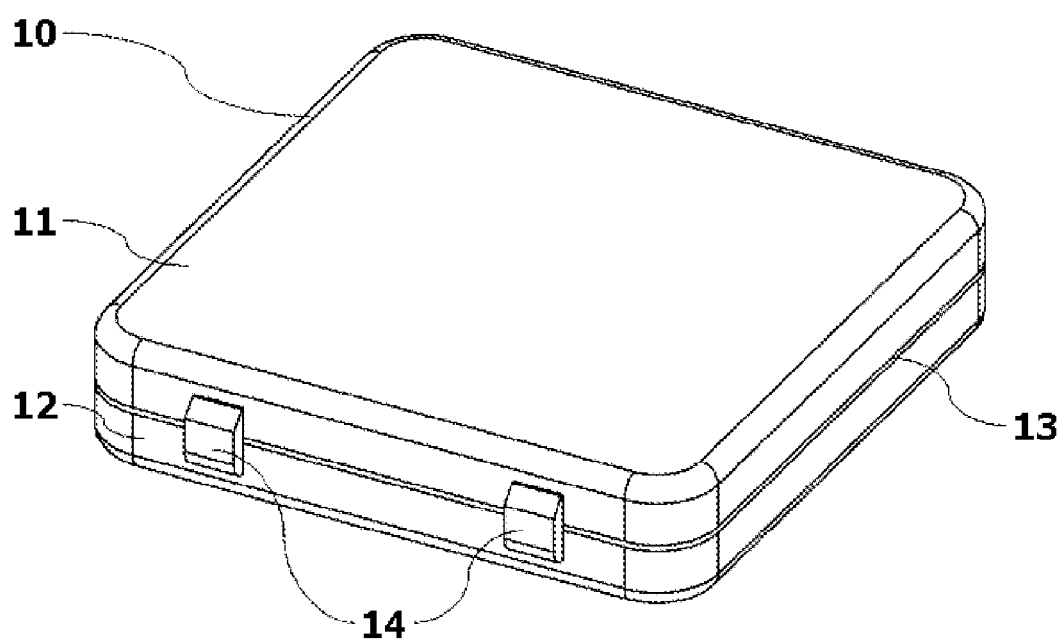
FIG. 7 is a stereoscopic view of the reticle POD of the present invention.

Furthermore, referring to FIG. 7, which is a view of another preferred embodiment of the present invention. As shown in FIG. 7, when the accommodation space of the reticle POD 10 needs to be formed as airtight, a seal element 13 can be further disposed on the rectangular periphery of the top cover 11 or the bottom cover 12 of the reticle POD 10 of the present invention for being pressed to isolate the accommodation space in the reticle POD 10 from exterior air. The seal element 13 in the present embodiment can be circular or rectangular, and elastic rubber or polymer resin (such as epoxy resin or electrically conductive adhesive) is used to form elastic seal element 13. Thus, when the top cover 11 and the bottom cover 12 are closed, the elastic seal element 13 is pressed to achieve the effect of complete airtightness and the reticle can be isolated from mist or particles in the air so that haze formation or contamination of reticle can be prevented and the lifetime of reticle can then be increased.

In addition, at least a latch piece 14 can be further disposed on the top cover 11 or the bottom cover 12 of the reticle POD 10 of the present invention for buckling the top cover 11 and the bottom cover 12 to form a piece and also pressing the aforementioned elastic seal element to achieve the effect of air-tightness. This latch piece 14 is disposed on another side opposite to the lock-fastener 15, and the material of the latch piece 14 can be plastic or metal according to the requirement of the design.

What is to be emphasized is that the major characteristic of the present invention lies in the improvement of the supporting component 100. The supporting component 100 can be disposed at the four corners of the top cover 11 and the bottom cover 12 of the reticle POD 10 so that when one side of the reticle is placed on the plurality of supporting components 100 of the bottom cover 12, another side of the reticle can be mounted by the plurality of supporting components 100 of the top cover 11 when the top cover 11 is closed, the reticle thus being securely disposed in-between the top cover 11 and the bottom cover 12. Therefore, in the process of transporting or transferring reticle POD 10, the elastic elements 130 on the supporting components 100 absorb excessive displacement whereas the shift of elastic elements 130 is restrained by the distance of suspension between the supporting pillar 153 and the top cover 11 or the bottom cover 12. With the excessive impact force absorbed by the design of elastic elements 130 and supporting pillar 153, the reticle can thus be provided with excellent support and protection. Moreover, the reticle POD 10 of the present invention can be formed by metal material using stamping or by engineering plastic material using injection molding, which is not limited in the present invention. When metal material is used as material for forming the top cover 11 and the bottom cover 12 of the reticle POD 10 of the present invention, structure of metal reticle POD with EMI shielding function can be formed and damage to the reticle caused by EMI can thus be prevented. Furthermore, in order to reinforce the EMI resistance of the metal reticle POD 10, the seal element 13 in the present embodiment can also be a seal element formed by electrically conductive adhesive. Therefore, when the seal element 13 formed by electrically conductive adhesive is closed within the metal reticle POD 10, not only can the whole metal reticle POD 10 form a metal shielding case, but the seal element 13 formed by electrically conductive adhesive can also eliminate static electricity on the metal reticle POD 10 and continue to isolate the reticle POD from the exterior air. And the material forming metal reticle POD of the present invention can be stainless steel series, aluminum alloy, or magnesium alloy.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A supporting component of substrate, comprising:
   a base body, perpendicularly assembled by one end of two supporting arms, the other end of said two supporting arms being respectively disposed with a mounting block;
   a pair of elastic elements, respectively disposed on said two supporting arms, each elastic element extending lengthwise from said supporting arms to form an extension and then extending horizontally along the inner side of said supporting arms to form another extension;
   a pair of leading elements, respectively connecting to said horizontal extension of said elastic elements and then extending lengthwise to form a stud bump, a first bevel and a second bevel being formed on the side of said stud bump located on the inner side of said supporting arm;
   a supporting base plate, having a first surface and a second surface opposite to another side of said first surface, said first surface of a first end and of a second end of said supporting base plate being respectively connected to said second bevel of said leading elements, and a supporting pillar being disposed at said second surface of a third end of said supporting base plate neighboring to said third end.

2. The supporting component according to claim 1, wherein said supporting pillar and said two mounting blocks are not coplanar.

3. The supporting component according to claim 1, wherein said mounting blocks have a through hole at the center.

4. The supporting component according to claim 3, wherein a hollow stud is further disposed in said through hole of said mounting blocks.

5. The supporting component according to claim 1, wherein a tip is further disposed on said first surface of said supporting base plate.

6. The supporting component according to claim 5, wherein a distance is kept between said tip and said supporting pillar.

7. The supporting component according to claim 1, wherein the material of said supporting component is polymer material.

8. The supporting component according to claim 1, wherein the angle of said first bevel is between 50 degrees and 75 degrees.

9. The supporting component according to claim 1, wherein the angle of said second bevel is between 70 degrees and 90 degrees.

10. A reticle POD comprising a top cover and a bottom cover, each corner of said bottom cover of said reticle POD being disposed with a supporting component for supporting and mounting reticle and on the same side of said top cover and said bottom cover of said reticle POD being disposed with at least a latch piece for assembling said top cover and said bottom cover, wherein the characteristic of said reticle POD lies in that:

the structure of said supporting component comprises:

a base body, perpendicularly assembled by one end of two supporting arms, the other end of said two supporting arms being respectively disposed with a mounting block;

a pair of elastic elements, respectively disposed on said two supporting arms, each elastic element extending lengthwise from said supporting arms to form an extension and then extending horizontally along the inner side of said supporting arms to form another extension;

a pair of leading elements, connecting to said horizontal extension of said elastic elements and then extending lengthwise to form a stud bump, a first bevel and a second bevel being formed on the side of said stud bump located on the inner side of said supporting arm;

a supporting base plate, having a first surface and a second surface opposite to another side of said first surface, said first surface of a first end and of a second end of said supporting base plate being respectively connected to said second bevel of said leading elements, and a supporting pillar being disposed at said second surface of a third end of said supporting base plate neighboring to said third end.

11. The reticle POD according to claim 10, wherein each corner of said top cover of said reticle POD is disposed with a supporting component.

12. The reticle POD according to claim 10, wherein a seal element is further disposed between said top cover and said bottom cover.

13. The reticle POD according to claim 10, wherein said supporting pillar and said two mounting blocks are not coplanar.

14. The reticle POD according to claim 10, wherein said mounting blocks have a through hole at the center.

15. The reticle POD according to claim 14, wherein a hollow stud is further disposed in said through hole of said mounting blocks.

16. The reticle POD according to claim 10, wherein a tip is further disposed on said first surface of said supporting base plate.

17. The reticle POD according to claim 16, wherein a distance is kept between said tip and said supporting pillar.

18. A metal reticle POD comprising a metal top cover and a metal bottom cover, each corner of said metal bottom cover of said metal reticle POD being disposed with a supporting component for supporting and mounting reticle and on the same side of said metal top cover and said metal bottom cover of said metal reticle POD being disposed with at least a latch piece for assembling said metal top cover and said metal bottom cover, wherein the characteristic of said metal reticle POD lies in that:

the structure of said supporting component comprises:

a base body, perpendicularly assembled by one end of two supporting arms, the other end of said two supporting arms being respectively disposed with a mounting block;

a pair of elastic elements, respectively disposed on said two supporting arms, each elastic element extending lengthwise from said supporting arms to form an extension and then extending horizontally along the inner side of said supporting arms to form another extension;

a pair of leading elements, connecting to said horizontal extension of said elastic elements and then extending lengthwise to form a stud bump, a first bevel and a second bevel being formed on the side of said stud bump located on the inner side of said supporting arm;

a supporting base plate, having a first surface and a second surface opposite to another side of said first surface, said first surface of a first end and of a second end of said supporting base plate being respectively connected to said second bevel of said leading elements, and a supporting pillar being disposed at said second surface of a third end of said supporting base plate neighboring to said third end.

19. The metal reticle POD according to claim 18, wherein each corner of said metal top cover of said metal reticle POD is disposed with a supporting component.

20. The metal reticle POD according to claim 18, wherein said supporting pillar and said two mounting blocks are not coplanar.

* * * * *